United States Patent [19]

Liu

[11] 4,171,242

[45] Oct. 16, 1979

[54] NEUTRAL PH SILICON ETCHANT FOR ETCHING SILICON IN THE PRESENCE OF PHOSPHOSILICATE GLASS

[75] Inventor: Cheng-Yih Liu, Woodbridge, Va.

[73] Assignee: International Business Machines Corporation, Armonk, N.Y.

[21] Appl. No.: 884,678

[22] Filed: Mar. 8, 1978

Related U.S. Application Data

[63] Continuation of Ser. No. 751,619, Dec. 17, 1976, abandoned.

[51] Int. Cl.² .............................................. H01L 21/306
[52] U.S. Cl. .................................... 156/657; 156/662; 252/79.3
[58] Field of Search ................ 156/662, 657; 252/79.3

[56] References Cited

U.S. PATENT DOCUMENTS

| | | | |
|---|---|---|---|
| 2,847,287 | 8/1958 | Landgren | 156/662 |
| 3,041,258 | 6/1962 | Sikina | 156/662 |
| 3,194,703 | 7/1965 | Nijmegen | 156/662 |
| 3,434,896 | 3/1969 | Chance | 252/79.5 |
| 3,497,407 | 2/1970 | Esch et al. | 156/662 |
| 3,930,870 | 1/1976 | Basi | 156/662 |
| 4,052,253 | 10/1977 | Kingzett | 252/79.3 |

OTHER PUBLICATIONS

Choudhury, "Substrate Surface . . . Silicon", *Journal of the Electrochemical Society*, vol. 118, No. 7 (1971), pp. 1183-1189.

Baran et al., "Anisotropic Etching . . . Silicon, " IBM Technical Disclosure Bulletin, vol. 19, No. 10 (3/77), p. 3953.

*Primary Examiner*—Jerome W. Massie
*Attorney, Agent, or Firm*—John E. Hoel

[57] ABSTRACT

A silicon etchant is disclosed composed of an aqueous solution of a fluoride ion and oxygen maintained at a substantially neutral pH. The etchant eliminates the problems of stripping organic photoresists, maintaining silicon/phosphosilicate glass selectively, silicon surface pitting, oxide residues, and insoluble reaction products.

14 Claims, 4 Drawing Figures

Etch rate of silicon in a solution of ammonium fluoride and hydrogen peroxide at three different temperatures versus quantity of pH buffering agent.

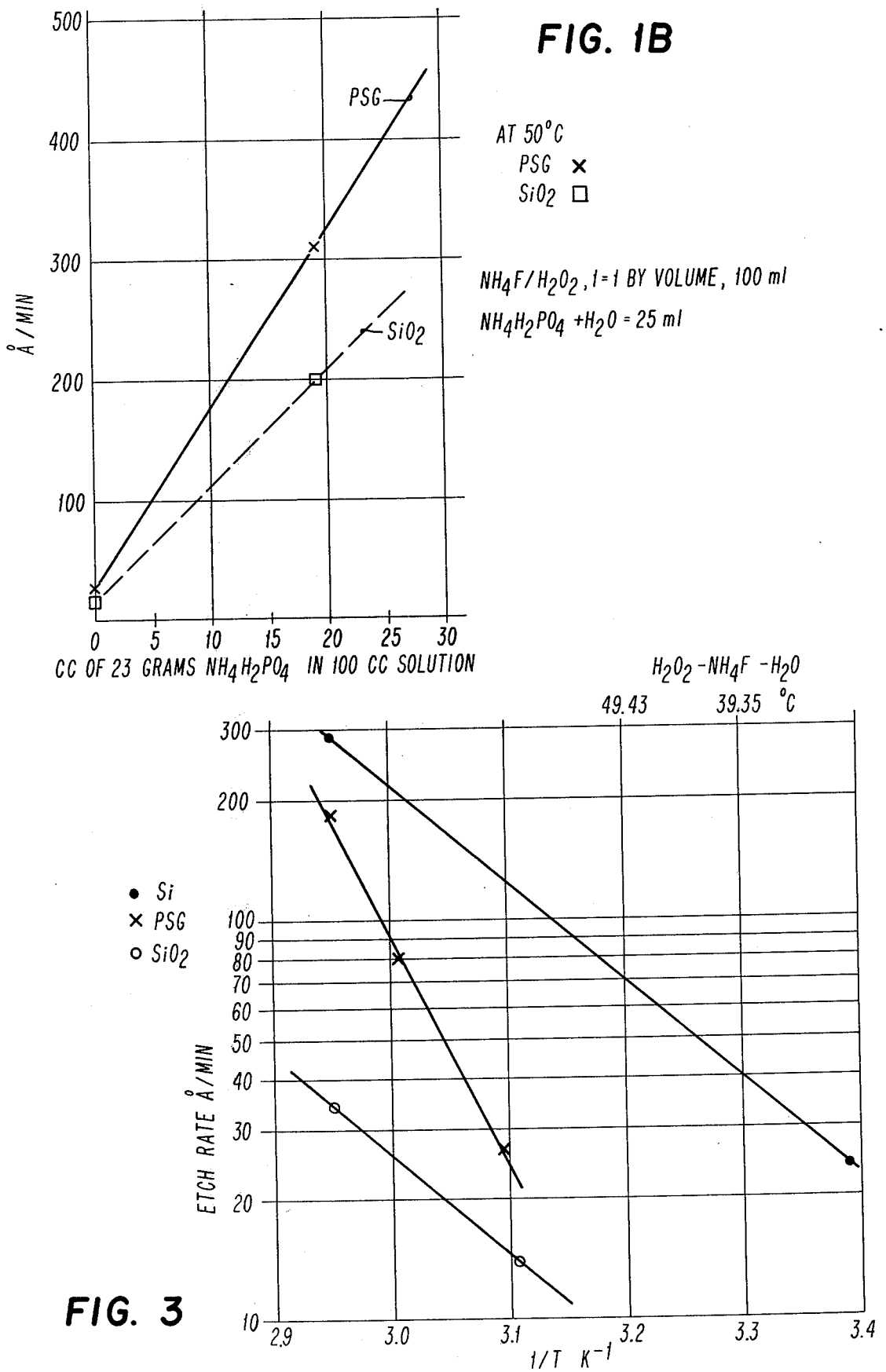

NEUTRAL PH SILICON ETCHANT FOR ETCHING SILICON IN THE PRESENCE OF PHOSPHOSILICATE GLASS

This is a continuation of application Ser. No. 751,619 filed Dec. 17, 1976 now abandoned.

FIELD OF THE INVENTION

The invention disclosed relates to semiconductor etchants and more particularly relates to an etchant for silicon.

BACKGROUND OF THE INVENTION

Conventional silicon etchants are classified as acidic or basic. Acidic etchants include solutions of nitric acid and hydrofluoric acid. Acidic silicon etchants employ a strong oxidizing agent which produce etching rates to fast for good control. Acidic silicon etchants are generally nonselective between silicon and phosphosilicate glass (PSG), and frequently etch PSG at a much faster rate than silicon. The strong oxidant present results in the uncontrolled formation of silicon dioxide layer on the silicon which results in extended exposure of uncovered surfaces to the etchant thereby resulting in a pitted surface. On the other hand, conventional basic silicon etchants generally contain a basic oxidant and a complexing agent which attacks organic photoresists, therefore requiring the necessity of an oxide mask. One of the disadvantages of an oxide mask is that it leaves a "shelf" at the edges of the etched region which can result in shorting and occlusion problems.

OBJECTS OF THE INVENTION

It is therefore an object of the invention to provide a silicon etchant which permits the use of a simple organic photoresist mask.

It is still another object of the invention to provide a silicon etchant which has a controllable etching rate.

It is still a further object of the invention to provide a silicon etchant which preferentially etches silicon with respect to the etching rate for phosphosilicate glass.

It is still a further object of the invention to provide a silicon etchant which does not produce pitting in the silicon surface.

It is still a further object of the invention to provide a silicon etchant which produces soluble reaction products.

SUMMARY OF THE INVENTION

These and other objects, features and advantages of the invention are accomplished by the neutral silicon etchant disclosed herein. The silicon etching composition of the invention comprises an aqueous solution of a fluoride ion and an oxygen containing compound maintained at a relatively neutral pH.

In the preferred embodiment, a wide variety of fluoride ion containing compounds can be employed, including ammonium fluoride and a wide variety of sources of oxygen atoms can be employed such as hydrogen peroxide. The pH of the aqueous solution is maintained between 6 and 8.2 by means of buffering agents. The resulting etching solution preferentially etches silicon with respect to phosphosilicate glass, will not attack organic photoresist, does not result in silicon surface pitting, and has soluble reaction products.

DESCRIPTION OF THE FIGURES

These and other objects, features and advantages of the invention will be more particularly appreciated with reference to the accompanying figures.

FIG. 1B is a graphical illustration of the etching rate for $SiO_2$ and PSG in an etching solution of ammonium fluoride and hydrogen peroxide verses quantity of buffering agents, ammonium hydrogen phosphate.

FIG. 3 is a graphical representation of the relative etching rates of silicon, phosphosilicate glass, and silicon dioxide at various temperatures for one embodiment of the etching solution composed of one part ammonium fluoride, one part hydrogen peroxide to one part water.

DISCUSSION OF THE PREFERRED EMBODIMENT

In its broadest concept, the inventive silicon etchant solution is an aqueous solution of fluoride ions and a source of oxygen atoms maintained at a relatively neutral pH of from 6 to 8.2. The mechanism for the etching reaction is as follows. A silicon surface exposed to the ambient normally acquires patina of silicon dioxide. By immersing such a silicon surface in an aqueous solution of a fluoride ion, the fluoride ion combines with the silicon dioxide patina yielding a silicon hexafluoride reaction product which is soluble in water such as is shown in the following Equation 1.

$$SiO_2 + 6HF \rightleftharpoons H_2SiF_6 + 2H_2O \qquad (1)$$

After the silicon surface has been exposed, a source of oxygen atoms in the aqueous solution yields oxygen which combines with the silicon yielding a silicon oxide intermediate compound such as is shown in the following Equation 2.

$$Si + xO^* \rightleftharpoons SiO_x \qquad (2)$$

The silicon oxide intermediate compound then reacts with the fluoride ions in the aqueous solution yielding once again, silicon hexafluoride as is shown in the following Equation 3.

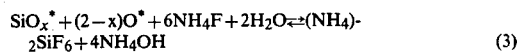

$$SiO_x^* + (2-x)O^* + 6NH_4F + 2H_2O \rightleftharpoons (NH_4)_2SiF_6 + 4NH_4OH \qquad (3)$$

Figure 2:
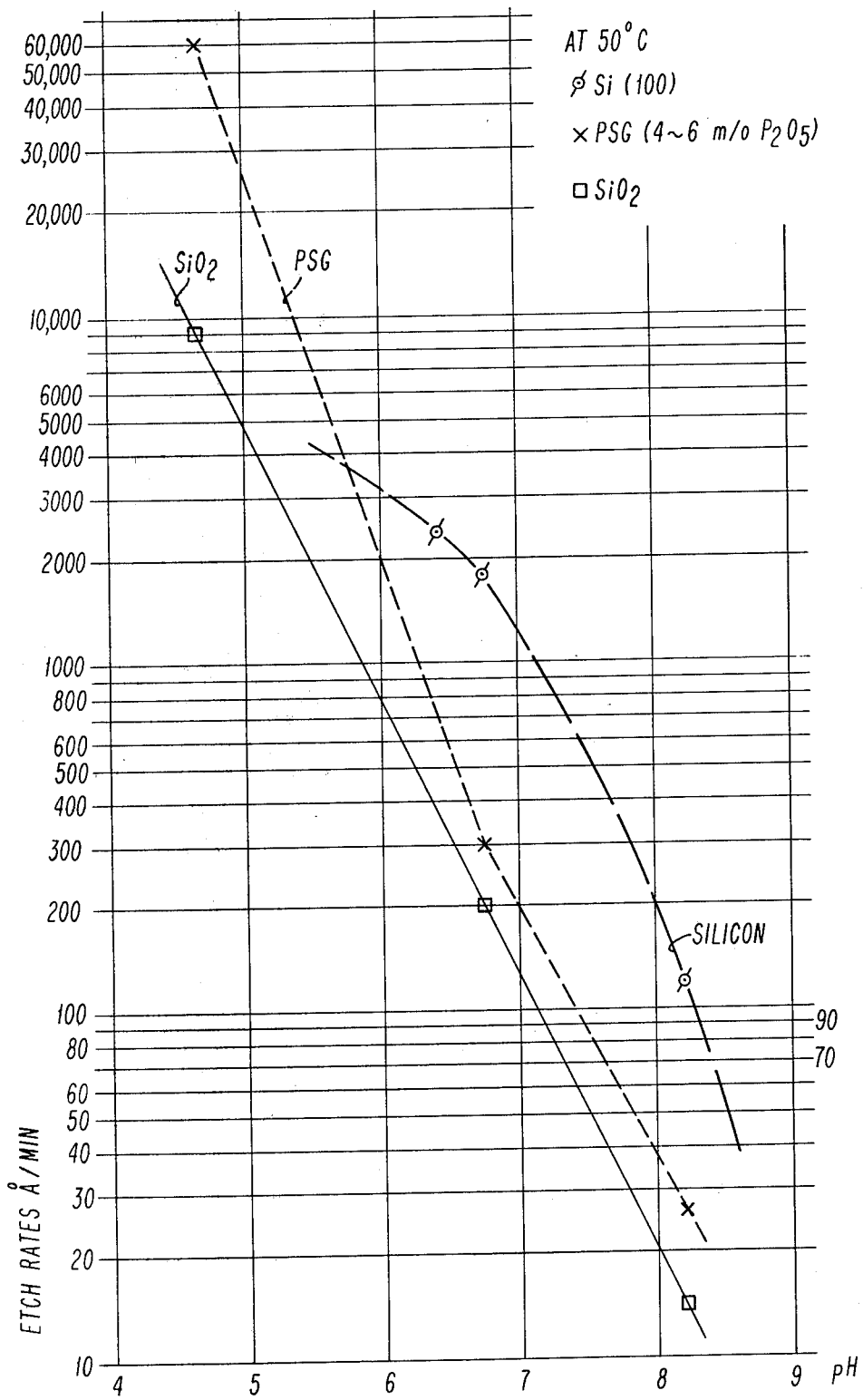
FIG. 2 is a graphical illustration of the relative etching rate of silicon and phosphosilicate glass over a pH range illustrating the relatively enhanced etching rate of silicon with respect to PSG for a relatively neutral pH for the etching solution.

Thus, the etching of the silicon surface proceeds. The etching rate of the silicon as a function of pH of the solution is illustrated in FIG. 2, wherein, to a 100 ml solution of 1 to 1 ammonium fluoride and hydrogen peroxide there was added a 25 ml solution of ammonium hydrogen phosphate, progressively reducing the pH of the etching solution. It is seen that the etching rate for the silicon increases as the pH of the solution decreases with a range of from 8.2 to 6.

Phosphosilicate glass is etched in the inventive etching solution by the following mechanism. Phosphosilicate glass can be represented as in Equation 4.

$$SiO_2 \cdot P_2O_{5y}, y = 0.02 \sim 0.06 \qquad (4)$$

Fluoride ions react with the phosphsilicate glass as expressed in Equation 4, so as to yield silicon hexafluoride directly, as is shown in Equation 5.

$$SiO_2 \cdot P_2O_{5y} + 6NH_4F + (2+y)H_2O \rightleftharpoons (NH_4)_2SiF_6 + 4NH_4OH + yH_3PO_4 \qquad (5)$$

Figure 1A:
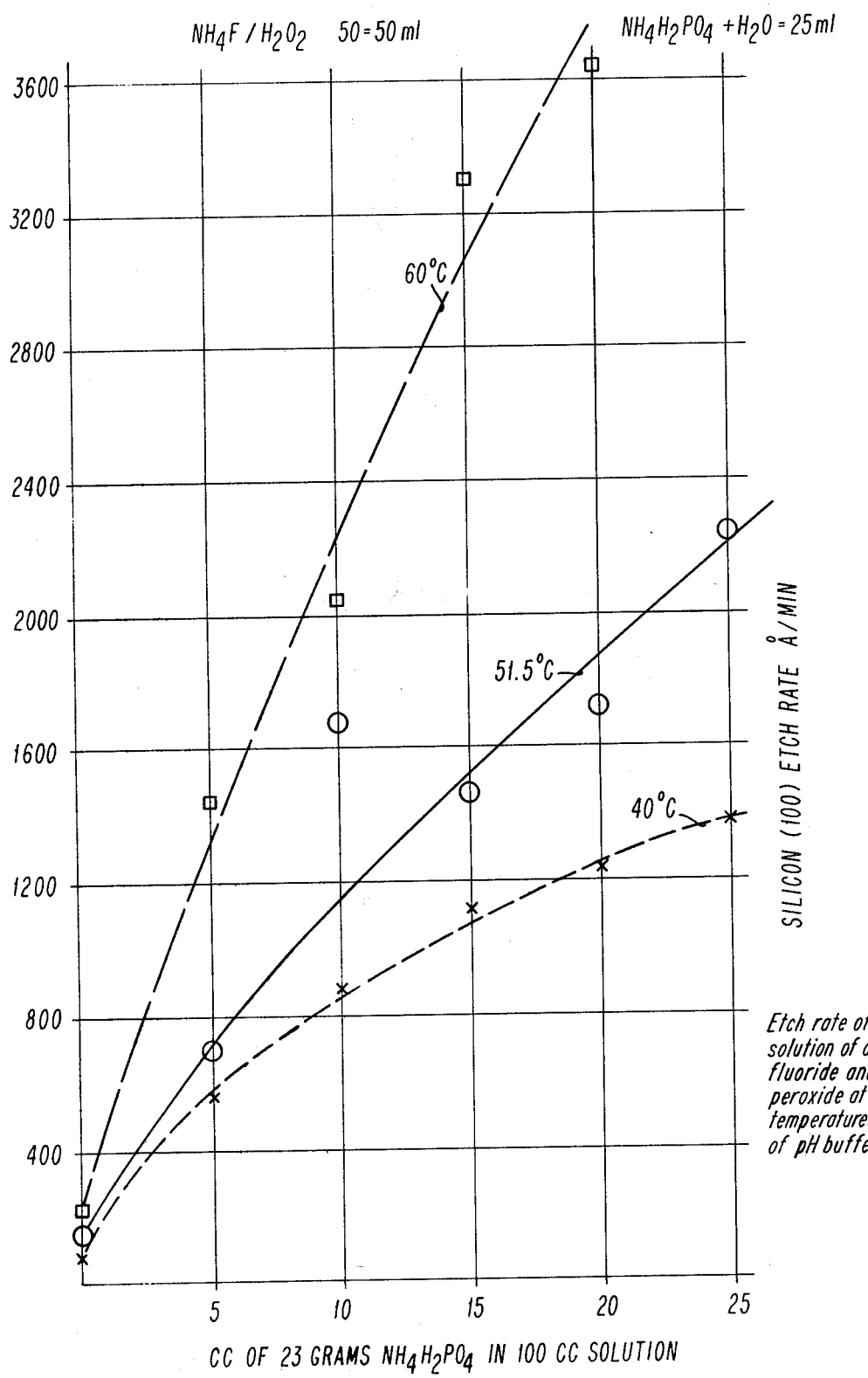
FIG. 1A is a graphical illustration of the etching rate for silicon in an etching solution of ammonium fluoride and hydrogen peroxide verses quantity of buffering agents, ammonium hydrogen phosphate.

No source of oxygen atoms is necessary in the mechanism for etching the phosphosilicate glass. FIG. 1B illustrates the etching rate of phosphosilicate glass in an etching solution similar to that used for FIG. 1A without the necessity of the presence of hydrogen peroxide, illustrating the increased etching rate of phosphosilicate glass as the pH is reduced by the addition of ammonium hydrogen phosphate. The addition of hydrogen peroxide to the aqueous solution of ammonium fluoride will not affect the etching rate of phosphosilicate glass.

FIG. 2 illustrates the relative etching rate for silicon and phosphosilicate glass over a broad range of pH values for an etching solution of ammonium fluoride and hydrogen peroxide. It is to be noted that the relative etching rate of PSG is reduced to less than that for silicon at a pH value of approximately 6 and that practical etching rates for the silicon, which now exceeds that for PSG, extend from a pH of about 6 up to a pH of about approximately 8.2. FIG. 3 is a detailed illustration of the relative etching rates of silicon as shown by the dot symbol, of PSG as shown by the x symbol and for silicon dioxide as shown by the circle symbol.

The approximate proportion of fluoride ions to oxygen atoms necessary for the silicon etching process, whose mechanism is denoted in equations 2 and 3 above, is approximately six parts of fluoride ions per two part oxygen atom.

The basic formulation for the etching composition requires a fluorine salt, an oxygen containing oxidant, and a solvent such as water. In addition, the pH value of the solution is maintained between 6 and 8.2 by means of an optional buffering agent.

Possible fluorine salts for the fluorine ion donor constituent can include compounds having the generalized formula $R_4NH_yF_{y+1}$ where y equals zero or one and R can be an organic radical or a hydrogen radical. The four organic radicals need not been identical but can be drawn from two or more different substituents. Generally, this composition can be characterized as a quaternary ammonium hydrofluoride. Another possible type of fluorine salt can be a simple quaternary ammonium fluoride of the generalized composition $R_4NF$ where R, once again can be an organic radical or hydrogen radical and the organic radicals need not all be identical.

Still another possible fluorine salt can be hydrofluoric acid.

Still a further possible fluorine salt can be and fluorine salt capable of releasing fluoride ions in the generalized formula $A_pF_q$ where p and q are integers.

Suitable oxygen containing oxidants which can be employed in the etching formulation can include hydrogen peroxide, gaseous oxygen, gaseous ozone.

Still other suitable oxygen containing oxidants can include:

$H_2BO_3^-$, $CH_3COO^-$, $H_2AsO_4^-$, $HAsO_4^{2-}$, $AsO_4^{3-}$, $NO_2^-$, $SO_3^{2-}$ $H_2PO_4^-$, $HPO_4^{2-}$, $PO_4^{3-}$, $SO_4^{2-}$, $CO_3^{2-}$, $HCO_3^-$, $HCOO^-$, $ClO_4^-$, $OCl^-$, $C_6H_5COO^-$, $MnO_4^-$, $Cr_2O_7^-$, $IO_3^-$, $BrO_3^-$, $H_2$-citrate$^-$, $H$-citrate$^{2-}$, citrate$^{3-}$, oxalate$^{2-}$, tartrate$^{2-}$, malonate$^{2-}$, succinate$^{2-}$, phthalate$^{2-}$.

The most suitable solvent for the reaction product silicon hexafluoride is water. However, the surface tension of the gaseous reaction products in the product can be modified by the addition of suitable alcohol such as isopropyl alcohol.

The pH value of the solution must be maintained between a value of 6 and the value of 8.2 illustrated in FIG. 2 so as to maintain an enhanced etching rate of silicon with respect of that for phosphosilicate glass. The means for adjusting the pH to the range of between 6 and 8.2 is by the addition of the suitable buffering agent which is optional. For those combinations of the fluorine salt and the oxygen containing oxidant which have a pH between 6 and 8.2, no buffering agent will be necessary. Suitable buffering agents can be for example, ammonium hydrogen phosphate which, as is shown in FIGS. 2A and 2B, can be added to modify the pH of the solution. As is shown in FIG. 1A for example, 23 grams of ammonium hydrogen phosphate can be added to water to make a 100 cc solution and that solution can be added in the volumes indicated in FIG. 1A, namely 1 part by volume of 40 percent by weight concentrated ammonium fluoride, one part by volume of 30 percent by weight hydrogen peroxide, and one half part by volume of a solution consisting of X percent by volume of an aqueous solution of 23 grams of monobasic ammonium phosphate per 100 ml of water and Y percent by volume of water, where $X + Y = 100$.

Still other buffer solutions having the pH of between 5 and 9 can be employed to bring basic or acidic etching solutions, respectively, into the desirable pH range of between 6 and 8.2.

The following are examples of etching compositions and their resulting etching rates for silicon and phosphosilicate glass.

EXAMPLE 1

An aqueous solution of ammonium fluoride and hydrogen peroxide containing one part 40% concentrated ammonium fluoride, one part 30% concentrated hydrogen peroxide to one part water is prepared. The resulting solution has a pH of between 8.0 and 8.2. Thus, no additional buffering agent is required. A silicon surface is having phosphosilicate glass structures thereon is etched at a temperature of approximately 60° C. The relative etching rates are approximately 300 Å per minute for silicon and approximately 180 Å per minute for phosphosilicate glass.

EXAMPLE 2

The solution of Example 1 can be buffered by the addition of 30 grams of ammonium hydrogen phosphate to one liter of the solution of Example 1 to adjust the pH thereof to between 6.7 and 7.2. The resulting etching rate for silicon at 40° C. is 1,000 Å per minute and that for PSG at 40° C. is 200 Å per minute. It is seen that the silicon etching rate is approximately five times that of phosphosilicate glass for this buffered solution at this temperature.

EXAMPLE 3

The pH solution described in Example 2 can be brought to almost exactly neutrality of the pH of approximately 7.2 by the addition of a small amount of concentration ammonium hydroxide. For example, 10 ml of concentrated ammonium hydroxide is added to one liter of the solution described in Example 2, which yields an etch rate for silicon at 40° C. at 800 Å per minute and a corresponding etch rate of phosphosilicate glass at 40° C. of 150 Å per minute.

EXAMPLE 4

In the compositions of other Examples 1, 2 or 3, the oxidant hydrogen peroxide can have substituted for it a gaseous oxygen or ozone which is bubbled into the solution by a conventional bubbler. The advantage of using a bubbler as the source of gaseous oxygen or ozone is that over a long etching period, as for example, approximately four hours, conducted at a relatively high temperature of above approximately 60° C., the hydrogen peroxide has a tendency to dissociate itself and therefore its concentration can vary. By using a bubbler, the concentration of the oxygen reactant can be maintained at a relatively constant level over the entire duration of the etching process.

EXAMPLE 5

Each of the solutions of Examples 1, 2 or 4 can have the ammonium fluoride reactant substituted by ammonium hydrofluoride which is merely another form of a fluorine ammonium salt.

EXAMPLE 6

Each of the solutions described in Examples 1, 2, 3 and 4 above, the ammonium fluoride reactant can have substituted for it hydrogen fluoride as the source of fluorine ions. Since hydrogen fluoride is highly acidic, it will be necessary to add a buffering solution of ammonium hydrogen phosphate and ammonium hydroxide to increase the pH of the resultant solution to a value of from 6 to 8.2.

Any of the above recited equivalent fluorine salts to ammonium fluoride and any of the above recited equivalent oxygen containing oxidents to hydrogen peroxide, can be substitued for the respective ammonium fluoride and hydrogen peroxide constituents in the solutions described in the above examples to obtain the desired enhanced etching rate of silicon over that of phosphosilicate glass, so long as the pH of the resulting solution is maintained between 6 and 8.2.

The resulting etchant has an enhanced etching rate for silicon over that for phosphosilicate glass, does not attack organic photoresists, does not result in silicon surface pitting, and has soluble reaction products, all advantages which are important to obtaining a high degree of control over the silicon etching process.

While the invention has been particularly shown and described with reference to the preferred embodiments thereof, it will be understood by those skilled in the art that the foregoing and other changes in form and detail may be made therein without departing from the spirit and scope of the invention.

I claim:

1. A method for preferentially etching a silicon workpiece in the presence of a phosphosilicate glass structure, comprising the steps of:
    applying to the surface of said silicon workpiece in the presence of said phosphosilicate glass structure, an aqueous solution of fluoride ions and oxygen atoms produced by an oxygen atom donor, maintained at a pH of between 6 and 8.2.

2. The method of claim 1, wherein fluoride ions are in the form of a quaternary ammonium hydrofluoride compound having the generalized formula $R_4NH_yF_{y-1}$ where y equals 0 or 1 and R can be an organic radical or a hydrogen radical.

3. The method of claim 1, wherein said fluoride ion compound comprises:
    a quaternary ammonium fluoride of the general description $R_4NF$ where R can be an organic radical or a hydrogen radical.

4. The method of claim 1, wherein said fluoride ion containing compound is hydrofluoric acid.

5. The method of claim 1, wherein said fluoride ion containing compound is a fluorine salt of the general description $A_pF_q$ where p and q are integers and A is a cation.

6. The method of claim 1, wherein said oxygen atoms are produced by hydrogen peroxide.

7. The method of claim 1, wherein said oxygen atoms are derived from gaseous oxygen or ozone.

8. The method of claim 1, wherein said oxygen atoms are derived from oxygen containing compounds selected from the group consisting of:
    $H_2BO_3^-$, $CH_3COO^-$, $H_2AsO_4^-$, $HAsO_4^{2-}$, $AsO_4^{3-}$, $NO_2^-$, $SO_3^{2-}$, $H_2PO_4^-$, $HPO_4^{2-}$, $PO_4^{3-}$, $SO_4^{2-}$, $CO_3^{2-}$, $HCO_3^-$, $HCOO^-$, $ClO_4^-$, $OCl^-$, $C_6H_5COO^-$, $MnO_4^-$, $Cr_2O_7^-$, $IO_3^-$, $BrO_3^-$, $H_2$-citrate$^-$, $H$-citrate$^{2-}$, citrate$^{3-}$, oxalate$^{2-}$, tartrate$^{2-}$, malonate$^{2-}$, succinate$^{2-}$, phthalate$^{2-}$.

9. The method of claim 1, wherein a buffering agent is added to said solution to control the pH of the etching solution between a value of 6 and 8.2.

10. The method of claim 9, wherein said buffering agent is ammonium hydrogen phosphate.

11. The method of claim 1, wherein the relative proportion of the constituents are substantially one part by volume of 40 percent by weight concentrated ammonium fluoride, one part by volume of 30 percent by weight hydrogen peroxide, and one part by volume of water.

12. The method of claim 11, wherein monobasic ammonium phosphate is added to the solution to reduce the small pH value and enhance the etching rate of silicon.

13. The method of claim 12, wherein the relative proportion of the constituents is one part by volume of 40 percent by weight concentrated ammonium fluoride, one part by volume of 30 percent by weight hydrogen peroxide, and one half part by volume of a solution consisting of X percent by volume of an aqueous solution of 23 grams of monobasic ammonium phosphate per 100 ml of water and Y percent by volume of water, where $X+Y=100$.

14. The method of claim 9, wherein said buffering agent is a solution of ammonium hydrogen phosphate and ammonium hydroxide.

* * * * *